(12) United States Patent
Sethuram et al.

(10) Patent No.: US 9,584,120 B2
(45) Date of Patent: Feb. 28, 2017

(54) INTEGRATED CIRCUIT LEAKAGE POWER REDUCTION USING ENHANCED GATED-Q SCAN TECHNIQUES

(71) Applicant: QUALCOMM Incorporated, San Diego, CA (US)

(72) Inventors: Rajamani Sethuram, San Diego, CA (US); Karim Arabi, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 271 days.

(21) Appl. No.: 13/887,517

(22) Filed: May 6, 2013

(65) Prior Publication Data
US 2013/0241593 A1 Sep. 19, 2013

Related U.S. Application Data

(62) Division of application No. 12/884,482, filed on Sep. 17, 2010, now Pat. No. 8,456,193.

(51) Int. Cl.
*H03K 19/173* (2006.01)
*H03K 19/00* (2006.01)
*G01R 31/3183* (2006.01)
*G01R 31/3185* (2006.01)
*G06F 17/50* (2006.01)

(52) U.S. Cl.
CPC ... *H03K 19/0008* (2013.01); *G01R 31/318342* (2013.01); *G01R 31/318575* (2013.01); *G06F 17/50* (2013.01); *H03K 19/173* (2013.01)

(58) Field of Classification Search
None
See application file for complete search history.

(56) References Cited

U.S. PATENT DOCUMENTS

| 4,425,666 A | 1/1984 | Groth, Jr. |
| 5,055,710 A | 10/1991 | Tanaka et al. |
| 5,539,344 A | 7/1996 | Hatakenaka |

(Continued)

FOREIGN PATENT DOCUMENTS

| CN | 1991688 A | 7/2007 |
| CN | 101185049 A | 5/2008 |

(Continued)

OTHER PUBLICATIONS

Abdollahi A, et al., "Leakage current reduction in sequential circuits by modifying the scan chains", Proceedings IEEE International Symposium on Quality Electronic Design; Mar. 24, 2003, XP002306227.

(Continued)

*Primary Examiner* — Crystal L Hammond
(74) *Attorney, Agent, or Firm* — Alan Gordon; Kenneth Vu

(57) ABSTRACT

Specific logic gates for Q-gating are selected by determining the minimum leakage state for a circuit design and then selecting logic gates that hold the circuit design in its lowest leakage state. Depending on the input desired to implement the minimum leakage state, the gate may be selected as a NOR or OR gate. Q-gating that is implemented with gates chosen to implement the minimum leakage state may be enabled during selected operating modes. The minimum leakage state of a circuit can be determined with an automatic test pattern generation (ATPG) tool.

18 Claims, 11 Drawing Sheets

(56) References Cited

U.S. PATENT DOCUMENTS

| | | | |
|---|---|---|---|
| 5,606,290 | A | 2/1997 | Pang |
| 6,473,485 | B1 | 10/2002 | Fernandez-Texon |
| 6,646,464 | B2 | 11/2003 | Maruyama |
| 6,677,783 | B2 | 1/2004 | Samaan |
| 6,813,750 | B2 | 11/2004 | Usami et al. |
| 7,102,382 | B2 | 9/2006 | Drenth et al. |
| 7,249,300 | B2* | 7/2007 | Chung ............ G01R 31/318536 714/726 |
| 7,442,997 | B2* | 10/2008 | Zhang .................... G11C 5/063 257/183 |
| 7,518,399 | B1* | 4/2009 | Santurkar et al. .............. 326/38 |
| 7,620,133 | B2 | 11/2009 | Cafaro et al. |
| 7,622,975 | B2 | 11/2009 | Hamdan et al. |
| 7,757,137 | B2 | 7/2010 | Ortiz et al. |
| 7,877,715 | B1* | 1/201 | Thirunavukarasu G01R 31/318533 714/727 |
| 7,966,538 | B2* | 6/2011 | Bertacco ............. G06F 11/2236 714/736 |
| 8,456,193 | B2 | 6/2013 | Sethuram et al. |
| 2003/0188241 | A1 | 10/2003 | Zyuban et al. |
| 2004/0155678 | A1 | 8/2004 | Anderson et al. |
| 2006/0156116 | A1 | 7/2006 | Allen et al. |
| 2007/0300108 | A1 | 12/2007 | Saint-Laurent et al. |
| 2008/0238494 | A1* | 10/2008 | Ortiz .............. G01R 31/318541 327/105 |
| 2009/0172615 | A1* | 7/2009 | Ortiz .............. G01R 31/318536 716/106 |
| 2009/0210728 | A1 | 8/2009 | Saint-Laurent et al. |
| 2009/0212818 | A1 | 8/2009 | Sakai et al. |
| 2009/0289557 | A1* | 11/2009 | Itoh .................... H05B 41/2882 315/127 |

FOREIGN PATENT DOCUMENTS

| | | |
|---|---|---|
| CN | 101216532 A | 7/2008 |
| GB | 2447944 A | 10/2008 |
| JP | H06510648 A | 11/1994 |
| JP | 2001141785 A | 5/2001 |
| JP | 2003255024 A | 9/2003 |
| JP | 2005115578 A | 4/2005 |
| JP | 2005148837 A | 6/2005 |
| JP | 2006020433 A | 1/2006 |
| JP | 2006220433 A | 8/2006 |
| JP | 2008245288 A | 10/2008 |
| JP | 2009175154 A | 8/2009 |
| WO | 9320618 A1 | 10/1993 |

OTHER PUBLICATIONS

Chakravarty S, et al., "Two techniques for minimizing power dissipation in scan circuits during test application", Test Symposium, 1994., Proceedings of the Third Asian NARA, Japan Nov. 15-17, 1994,Los Alamitos, CA, USA,IEEE Comput. Soc, Nov. 15, 1994, pp. 324-329, XP010125984, DOI: 10.1109/ATS.1994.367211 ISBN: 978-0-8186-6690-2 Chapter 3, 4.

"Feng Gao,Exact and Heuristic Approaches to Input Vector Control for Leakage Power Reduction,IEEE Transactions on Computer-aided Design,vol. 25, No. 11,Nov. 2006,2564-2571.".

GA Arschwin Fey: "Deterministic Algorithms for ATPG under Leakage Constraints", Asian Test Symposium, 2009. ATS 09, IEEE, Piscataway, NJ, USA, Nov. 23, 2009, pp. 313-316, XP031584465,ISBN: 978-0-7695-3864-8.

Gorschwin Fey et al: "Targeting Leakage Constraints during ATPG", Asian Test Symposium, 2008. ATS '08. 17th, IEEE, Piscataway, NJ, USA, Nov. 24, 2008, pp. 225-230, XP031373851, ISBN: 978-0-7695-3396-4.

International Preliminary Report on Patentability—PCT/US2011/051745, The International Bureau of WIPO—Geneva, Switzerland, Oct. 29, 2012.

International Search Report and Written Opinion—PCT/US2011/051745—ISA/EPO—Jan. 31, 2012.

Khatri, "A Modified Scan-D Flip-flop Design to Reduce Test Power," Department of ECE, Texas A&M University, pp. 3.

Krishna Kumar S, et al., "Customizing pattern set for test power reduction via improved X—identification and reordering", Low-Power Electronics and Design (ISLPED),2010 ACM/IEEE International Symposium on,IEEE, Piscataway, NJ, USA, Aug. 18, 2010, pp. 177-182, XP031773572,ISBN: 978-1-4244-8588-8.

"Rahul M. Rao, A Heuristic to Determine Low Leakage Sleep State Vectors for CMOS Combinational Circuits,Proceedings of the International Conference on Computer Aided Design (ICCAD'03),pp. 689-692".

* cited by examiner

INTEGRATED CIRCUIT LEAKAGE POWER REDUCTION USING ENHANCED GATED-Q SCAN TECHNIQUES

CROSS REFERENCE TO RELATED APPLICATIONS

This application is a divisional application of U.S. patent application Ser. No. 12/884,482 entitled "Integrated Circuit Leakage Power Reduction Using Enhanced Gated Q-Scan Techniques" filed on Sep. 17, 2010, the disclosure of which is expressly incorporated herein by reference in its entirety.

TECHNICAL FIELD

The present disclosure generally relates to integrated circuit design. More specifically, the present disclosure relates to designing integrated circuits having reduced leakage power.

BACKGROUND

Integrated circuits (ICs) are commonly designed using design-for-test techniques such as scan-based design in which scan flip flops are included in the IC designs to facilitate test mode operations of the IC. Scan flip flops are similar to standard flip flops but include a scan input, a scan output and an enable input. The enable input toggles the scan flip flop between operating mode and testing mode. When the enable input is asserted, the scan flip flops function in scan mode in which test inputs and test outputs can be transmitted via the scan input and scan output. When the enable input is deasserted, the scan flip flop operates as a standard flip flop in which input is received via the data input.

In scan based design, registers in the design are converted to scan flip flops 102 which are stitched together as shown in FIG. 1 to operate as an oversized shift register during test mode of operation. During test mode, a shift operation is first performed in which a test vector is shifted into the circuit via the scan flip flops 102. The test vector propagates through the combinational logic of the ICs internal circuitry, which is also referred to herein as the "cone of logic" 104. A capture operation can then be performed in which a test response is captured by the scan flip flop 102. The response data from the cone of logic is shifted out while a next test vector is shifted in.

During each shift a large number of scan flip flops toggle simultaneously in response to the test vector input. These toggles cause additional toggle activity throughout the entire cone of logic. Toggle activity during a shift can greatly exceed the toggle activity that occurs during normal operating mode of the circuitry. The toggle activity consumes enormous amounts of power which can detrimentally affecting the correct operation of the circuit during test and can decrease reliability of the circuit.

One design-for-test technique for reducing power consumption during shift operations is referred to as "gated-q" design. According to gated-q design, logic gates are added to the circuit design between the q-output of each scan flip flop and the cone of logic. A shift line to the logic gates is asserted during shift operations. Assertion of the shift line causes output from the logic gates to the cone of logic to be held in a single state during shift operations. In this way, the q-output of each scan flip flop is the to be "gated" during shift mode.

An example of q-gating is shown in FIG. 2 in which OR gates 202 gate the scan flop output. The OR gates 202 drive a logic '1' at each input to the cone of logic 204 when the shift line 206 is asserted, e.g. during a shift operation. Because the inputs to the cone of logic 204 are held at a logic '1', the combinational logic circuitry in the cone of logic 204 does not toggle during the shift operation so dynamic power consumption is substantially reduced.

Another example of q-gating is shown in FIG. 3 in which NOR gates 302 hold inputs to the cone of logic 304 in a single state. The NOR gates 302 hold logic '0' at each input to the cone of logic 304 during a shift operation in response to assertion of a shift line 306. Input to each of the NOR gates 302 from the corresponding scan flip flop 308 is inverted so that the NOR gates 302 transmit the same value received from the scan flip flop 308 when the shift line 306 is not asserted. Holding the inputs to the cone of logic 304 in a single state prevents propagation of toggle activity throughout the cone of logic and thereby prevents substantial dynamic power losses.

While the q-gating examples described with reference to FIG. 2 and FIG. 3 substantially reduce power that would otherwise be consumed due to propagated toggling of the combinational logic, e.g. dynamic power losses, IC designs are also subject to static power losses. Static power losses due to current leakage in the combinational logic may be even greater than dynamic power in present IC designs. The term "leakage power" refers to the power consumed by a circuit design due to leakage currents when the transistors of the circuit are in their OFF state.

Leakage power consumed by a logic gate depends on the input pattern applied to it. For example. FIG. 4, shows a 2-input NAND gate 402 and a schematic diagram 404 of the transistors within the 2-input NAND gate. When a '00' input is applied, lesser leakage power is consumed compared to all other input combinations. This is because both transistors T1 & T2 will be OFF. This creates a higher drain to source resistance which results in a lesser leakage current and a lesser leakage power.

The minimal leakage state of a circuit design is the state of the design that consumes the least leakage power. This occurs when as many possible logic gates or other components are parked in their least leakage state such that the overall leakage power of the circuit is minimal. The problem of identifying a minimal leakage state for a given design is a complex problem for which various solutions or approximations have been postulated. However such solutions have generally been un suitable for practical application in designing ICs.

BRIEF SUMMARY

Embodiments of the present disclosure reduce leakage power by determining minimal leakage states of combinational logic in a circuit design and parking the combinational logic in its minimum leakage states during certain modes of operation.

Aspects of the present disclosure include a hardware technique to park a circuit in its least leakage state. The inserted hardware reduces leakage power during several circuit operating modes. Another aspect of the disclosure includes a hardware technique to reduce leakage power consumed by a chain of scan flip flops in a scan path when the scan path is not used.

One aspect of the disclosure includes a circuit having logic circuitry and a number of scan flip flops coupled to the logic circuitry. A number of gates are coupled between the logic circuitry and the number of scan flip flops. The gates are selected to hold a minimal leakage state of the logic circuitry. According to another aspect of the disclosure 0-gated scan flip flops and 1-gate scan flip flops are selected to hold a minimum logic state of the logic circuitry.

An aspect of the present disclosure includes a circuit including q-gate logic for holding logic circuitry in a minimum leakage state. Multiplexer circuitry connected to the q-gate logic asserts the minimum leakage state for a number of operating modes of the circuit. Another aspect of the disclosure includes a circuit having means for holding the logic circuitry in a minimum leakage state and means for asserting the minimum leakage state for a number of operating modes of the circuit.

Another aspect of the disclosure includes a circuit having a scan path including a chain of scan flip flops configured for shifting a test vector to circuitry under test. Multiplexer circuitry is coupled to an input of the scan path. The multiplexer circuitry includes an enable input and is configured to output a logical '0' to the scan path input upon assertion of the enable input.

Another aspect of the disclosure includes a method of generating a minimum leakage state in an integrated circuit design. The method includes defining a fault model in an automatic test pattern generator tool in which each fault represents a unique Boolean combination at inputs of a standard cell in the integrated circuit design. A gain function is computed for each of the faults. The gain function represents the average leakage power reduction for a corresponding fault. The faults are sorted in order of the computed gain function for the faults. A vector set is generated by performing an automatic test pattern generation to detect as many of the faults as possible with vectors of the set. A vector of the set is selected in which a summation of gains corresponding to the faults detected by the vector is maximum.

Another aspect of the disclosure includes an apparatus for generating a minimum leakage state in an integrated circuit design. The apparatus includes means for defining a fault model in an automatic test pattern generator tool in which each fault represents a unique Boolean combination at inputs of a standard cell in the integrated circuit design. The apparatus also includes means for computing a gain function for each of the faults and means for sorting the faults in order of the computed gain function for the faults. The apparatus also includes means for generating a vector set by performing an automatic test pattern generation to detect as many of the faults as possible with vectors of the set and means for selecting a vector of the set in which a summation of gains corresponding to the faults detected by the vector is maximum.

Another aspect of the disclosure includes a computer program product including a computer-readable medium having program code recorded thereon. The program code includes program code to define a fault model in an automatic test pattern generator tool in which each fault represents a unique. Boolean combination at inputs of a standard cell in the integrated circuit design, program code to compute a gain function for each of the faults in which the gain function represents the average leakage power reduction for a corresponding fault, and program code to sort the faults in order of the computed gain function for the faults. The program code also includes program code to generate a vector set by performing an automatic test pattern generation to detect as many of the faults as possible with vectors of the set and program code to select a vector of the set in which a summation of gains corresponding to the faults detected by the vector is maximum.

In another aspect, a circuit includes logic circuitry and scan flip flops coupled to the logic circuitry. The circuit also includes means for holding a minimal leakage state of the logic circuitry, the holding means being coupled between the logic circuitry and the plurality of scan flip flops.

In yet another aspect, a circuit has means for holding logic circuitry in a minimum leakage state. The circuit also has means for asserting the minimum leakage state for operating modes of the circuit. The asserting means is coupled to the holding means.

In a further aspect, a circuit has means for shifting a test vector to circuitry under test. The circuit also has multiplexer circuitry coupled to an input of the shifting means. The multiplexer circuitry includes an enable input and is configured to output a logical '0' to the scan path input upon assertion of the enable input.

Additional features and advantages of the disclosure will be described below. It should be appreciated by those skilled in the art that this disclosure may be readily utilized as a basis for modifying or designing other structures for carrying out the same purposes of the present disclosure. It should also be realized by those skilled in the art that such equivalent constructions do not depart from the teachings of the disclosure as set forth in the appended claims. The novel features, which are believed to be characteristic of the disclosure, both as to its organization and method of operation, together with further objects and advantages, will be better understood from the following description when considered in connection with the accompanying figures. It is to be expressly understood, however, that each of the figures is provided for the purpose of illustration and description only and is not intended as a definition of the limits of the present disclosure.

BRIEF DESCRIPTION OF THE DRAWINGS

For a more complete understanding of the present disclosure, reference is now made to the following description taken in conjunction with the accompanying drawings.

DETAILED DESCRIPTION

Embodiments of the present disclosure reduce leakage power by determining a reduced or minimum leakage state of combinational logic in the logic cone and parking the combinational logic in its reduced or minimum leakage state during certain modes of operation. A q-gating cell including additional hardware is inserted to gate the scan flip-flops q-output and park the logic cones in their minimal leakage state. The q-gating cell is controlled such that leakage power is reduced during several circuit modes such as: functional sleep mode; shift mode; capture mode and other test mode operations, for example. Although the term "minimum" is used throughout this application, it is understood that reduced or minimum is intended to be covered.

According to aspects of the present disclosure, hardware overhead can be limited within a user defined hardware overhead budget. By inserting the gating-logic only at the output of flops that do not lie in timing critical paths, timing of the circuit is not degraded. An automatic test pattern generation (ATPG) tool may be used to determine the minimal leakage state (MLS).

Figure 1:
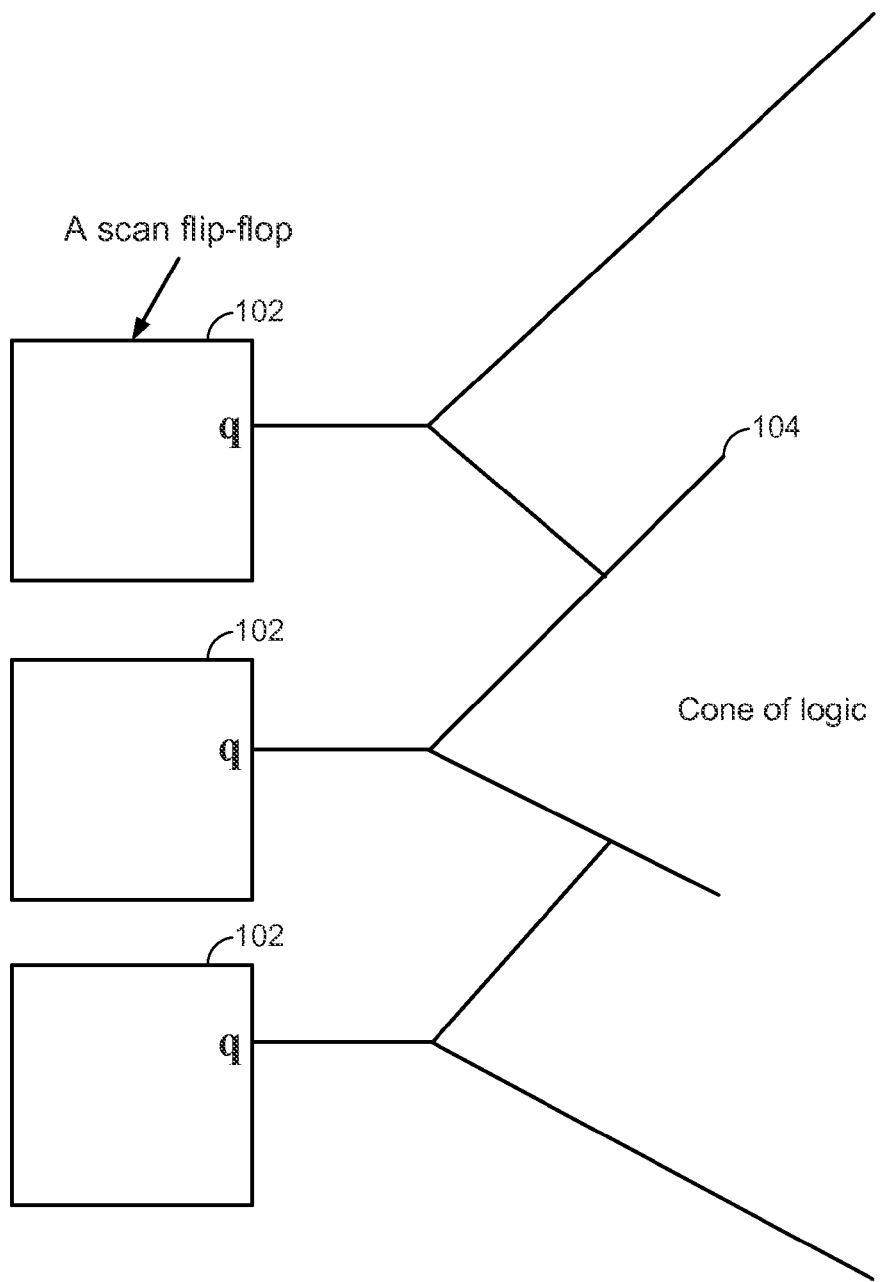
FIG. 1 is a block diagram illustrating a conventional set of scan flip flops for testing logic circuitry.
Figure 2:
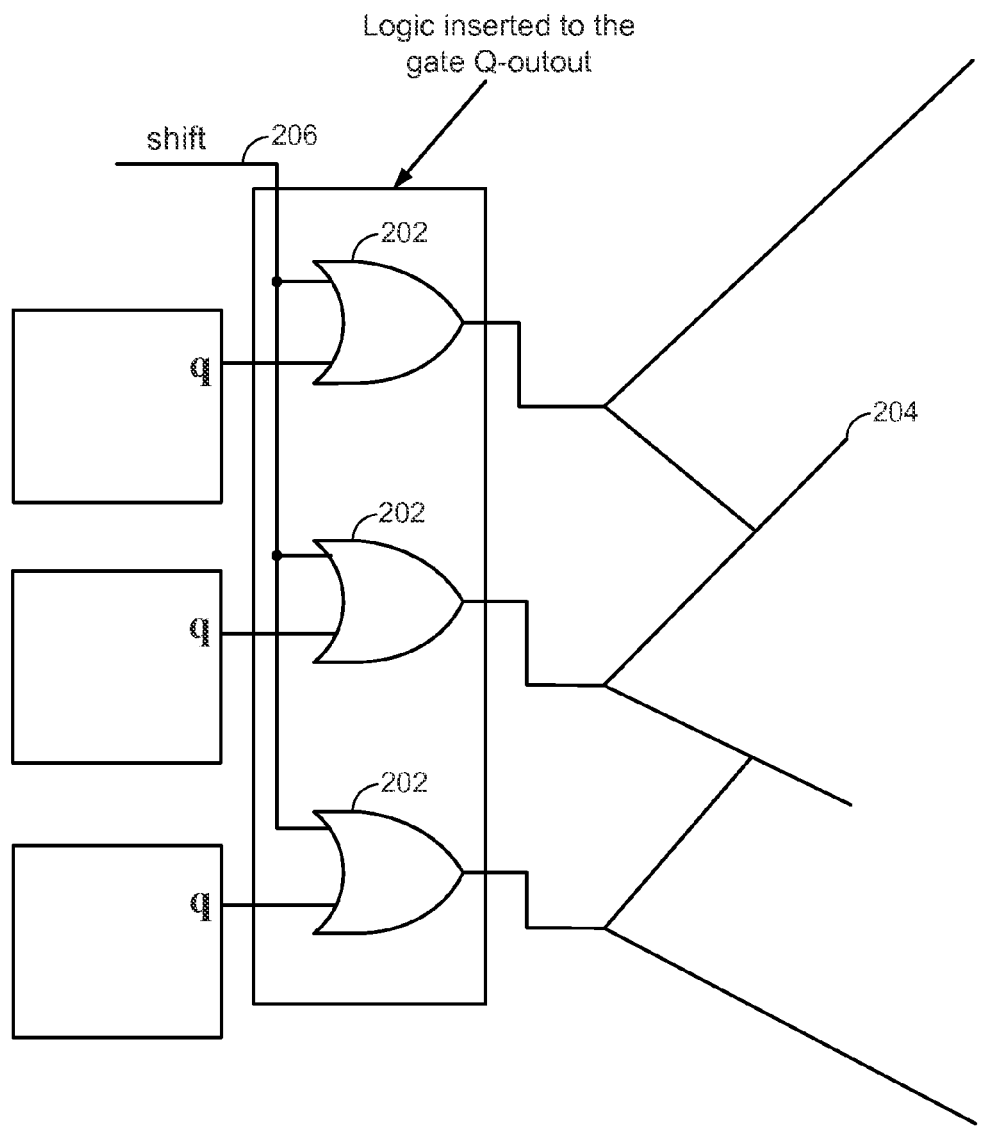
FIG. 2 is circuit schematic diagram illustrating a conventional gated-q design for testing logic circuitry.
Figure 3:
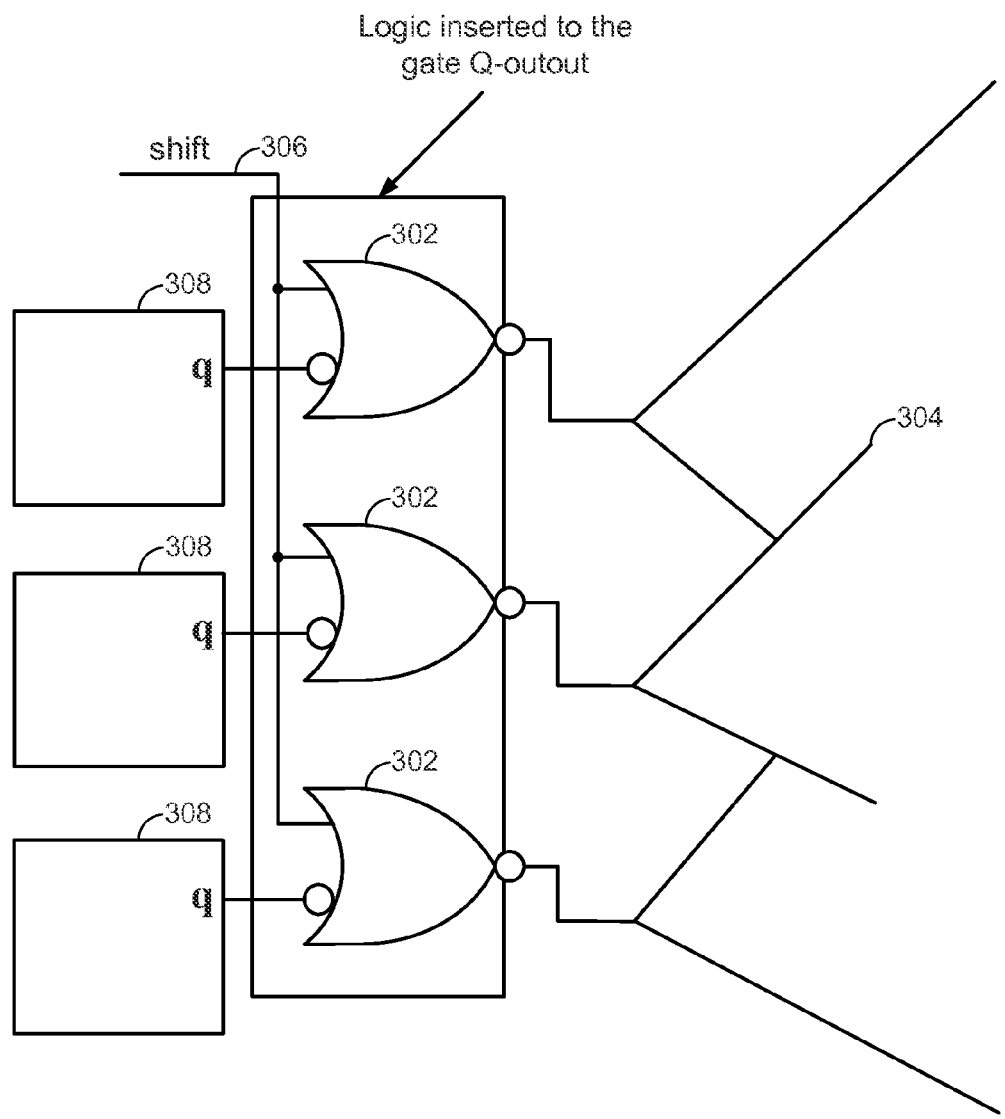
FIG. 3 is circuit schematic diagram illustrating a conventional gated-q design for testing logic circuitry.
Figure 4:
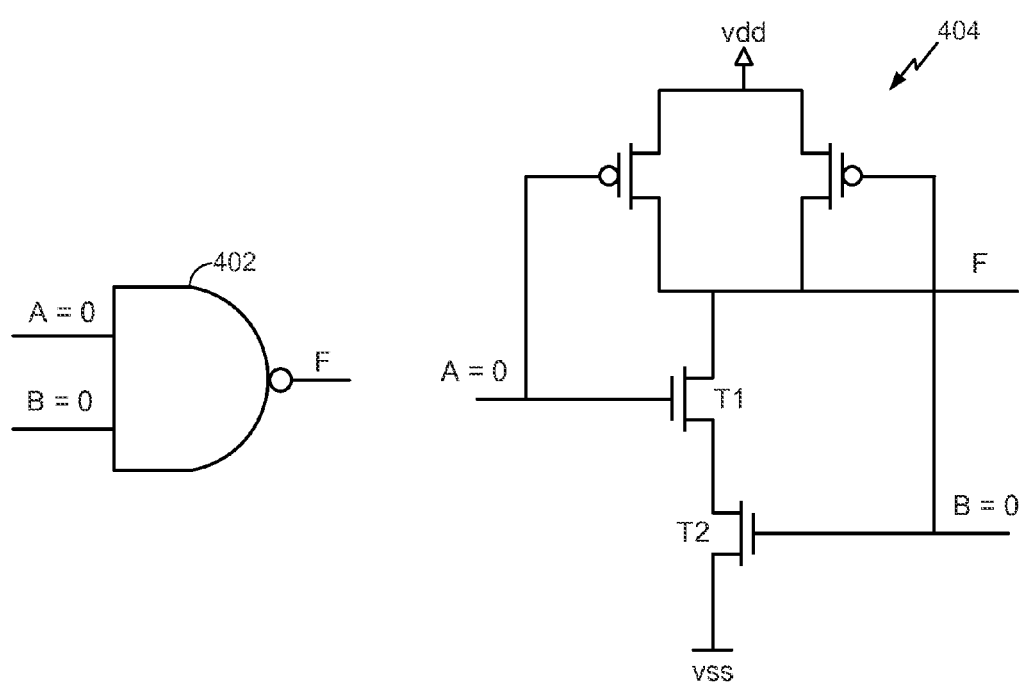
FIG. 4 is diagram of a standard symbol for a NAND gate and a schematic diagram of circuitry for implementing the NAND gate.
Figure 5:
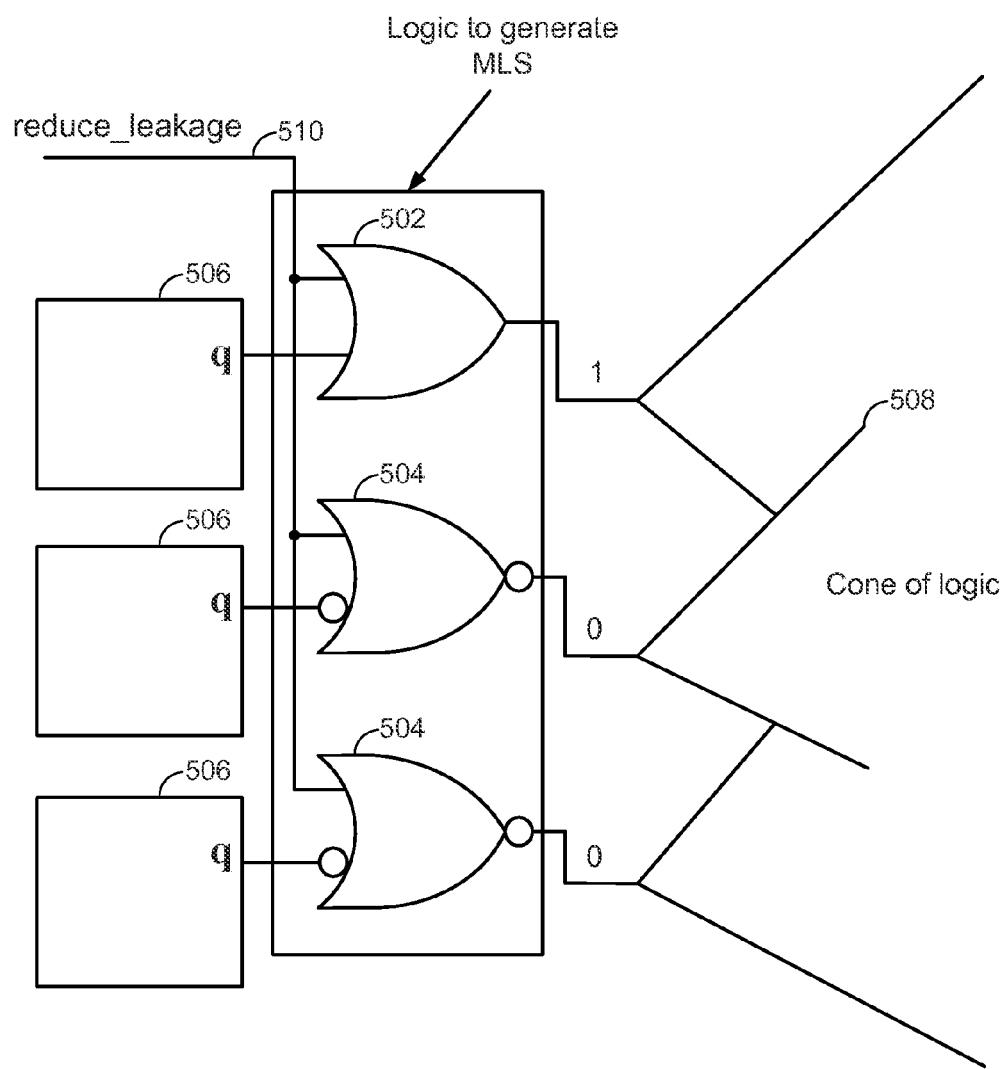
FIG. 5 is a schematic diagram of logic circuitry for implementing a minimum leakage state of a cone of logic according to an illustrative embodiment of the disclosure.

Once the minimum leakage state is determined, certain hardware can be added to the circuitry to facilitate parking the logic circuitry in the minimum leakage state. Referring to FIG. 5, according to one aspect of the present disclosure, a combination of OR gates 502 and NOR gates 504 can be inserted between scan flip flops 506 and the cone of logic 508 to park the design in its minimum leakage state. For example, in the circuit with only three flops as shown in FIG. 5, state '001' has been determined to be the minimal leakage state of the logic cone 508. In order to park the logic cone 508 in its minimum leakage state, state '001' is applied to the inputs of the logic cone 508 as shown.

According to aspects of the present disclosure, an OR gate 502 is included in the hardware to generate the logical '1' bits of state '001' and two NOR gates 504 are included in the hardware to generate the logical '00' bits of state '001'. A control line called reduce leakage 510 is connected to OR gates 502 and NOR gates 504. When the control line 510 is asserted, the entire logic cone 508 is parked in its 001 state, i.e., the minimum leakage state. Input to each of the NOR gates 504 from the corresponding scan flip flop 506 is inverted so that the NOR gates 504 transmit the same value received from the scan flip flop 506 when the control line 510 is not asserted.

According to aspects of the present disclosure, the cone of logic can be parked in a minimum leakage state to conserve power during certain modes of normal operation of the circuitry in addition to during test modes. The reduce_leakage signal may be asserted in any of the modes that the minimum leakage state is desired.

Figure 6:
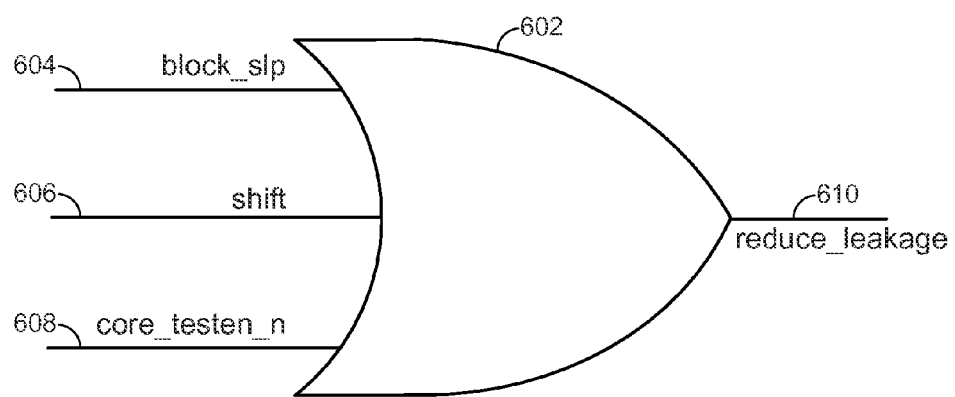
FIG. 6 is a symbolic representation of an OR gate to enable a minimum leakage state of circuit for multiple operating modes of the circuit.

Referring to FIG. 6, a three input OR gate 602 multiplexes three separate control signals, block_slp 604, shift 608, and core_testen_n 608. The "reduce_leakage" signal is the signal that should be asserted to park a circuit in its least leakage state. The reduce_leakage 610 signal will be asserted if block_slp 604 is asserted or shift 606 is asserted or core_testen 608 is not asserted. The block sip 604 signal is asserted when the block of circuitry to which the MLS generation hardware is connected in the cone of logic is in the functional sleep mode. The signal "block_slp", is asserted if that block is in a functional standby mode to reduce leakage during the functional mode. The shift 606 signal is asserted when the cone of logic is in the shift mode. The signal "shift" is asserted during the scan shift mode to reduce the dynamic shift power. The core_testen_n 608 signal indicates that core circuitry is being tested during the test mode. The signal "core_testen_n" is asserted if that particular block is not tested during an Iddq testmode, for example, so leakage current drained by that block during Iddq test is minimized. Although only three control signals are shown as inputs to the three input OR gate 602, it should be understood that fewer than three or more than three signals may be OR'ed or otherwise logically combined or multiplexed to reduce leakage during other operating modes of operation or combinations thereof.

Figure 7:
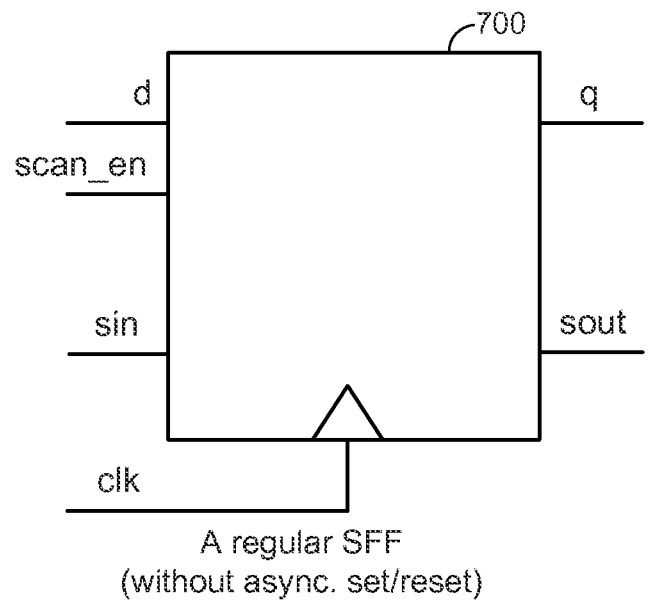
FIG. 7 is a symbolic representation of a conventional scan flip flop.
Figure 8:
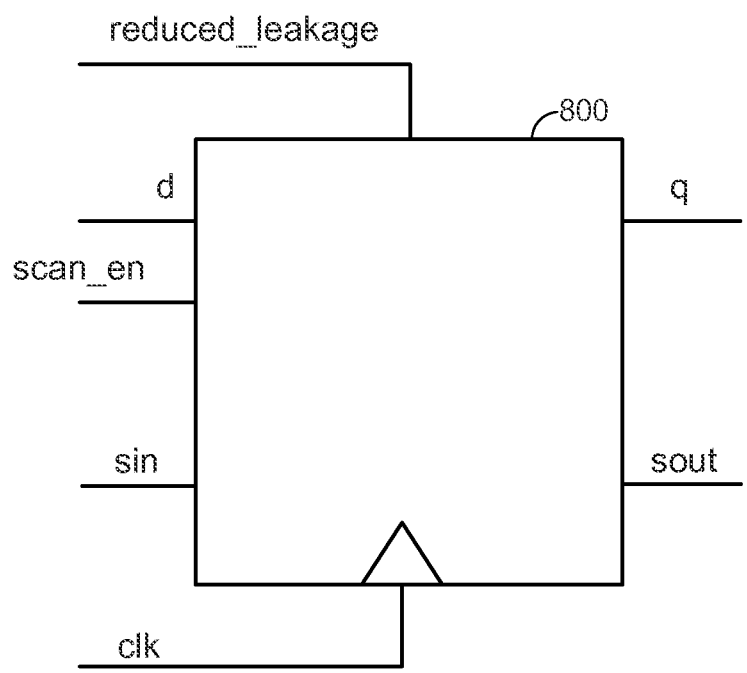
FIG. 8 is a symbolic representation of a 0/1 gated scan flip flop.

According to an alternative embodiment of the present disclosure, the gating logic hardware to implement a minimum logic state may be added inside of regular scan flip flops. FIG. 7 shows an example of a standard scan flip flop 700. FIG. 8 shows an example of a modified scan flip flop 800 which internally includes the additional hardware to hold a logical 1 or 0 when an enable signal, labeled reduced_leakage in this example, is asserted. For the flip flop 700 shown in FIG. 7, "d" is the data pin, and "sin" is the scan input pin. The pin labeled "scan_en" is the scan enable pin. The flip flop 700 is clocked by the "clk" pin. The pin labeled "q" represents the FLOP output and the pin labeled "sout" is the scan output pin.

A modified scan flip flop that outputs a logical '1' upon assertion of the enable signal is called 1-gated scan flip flops and may be used to replace the OR gate and the corresponding scan flip flop shown in FIG. 5, for example. Modified scan flip flops that output a logical '0' upon assertion of the enable signal are called 0-gated scan flip flops and may be used to replace the NOR gates and the corresponding scan flip flops shown in FIG. 5. Both 1-gated scan flip flops and 0-gated scan flip flops are included in standard cell libraries. According to this aspect of the disclosure, regular scan flip-flops can be swapped with 0/1-gated scan flip flops during synthesis or after synthesis, to generate the minimum logic state.

Figure 9:
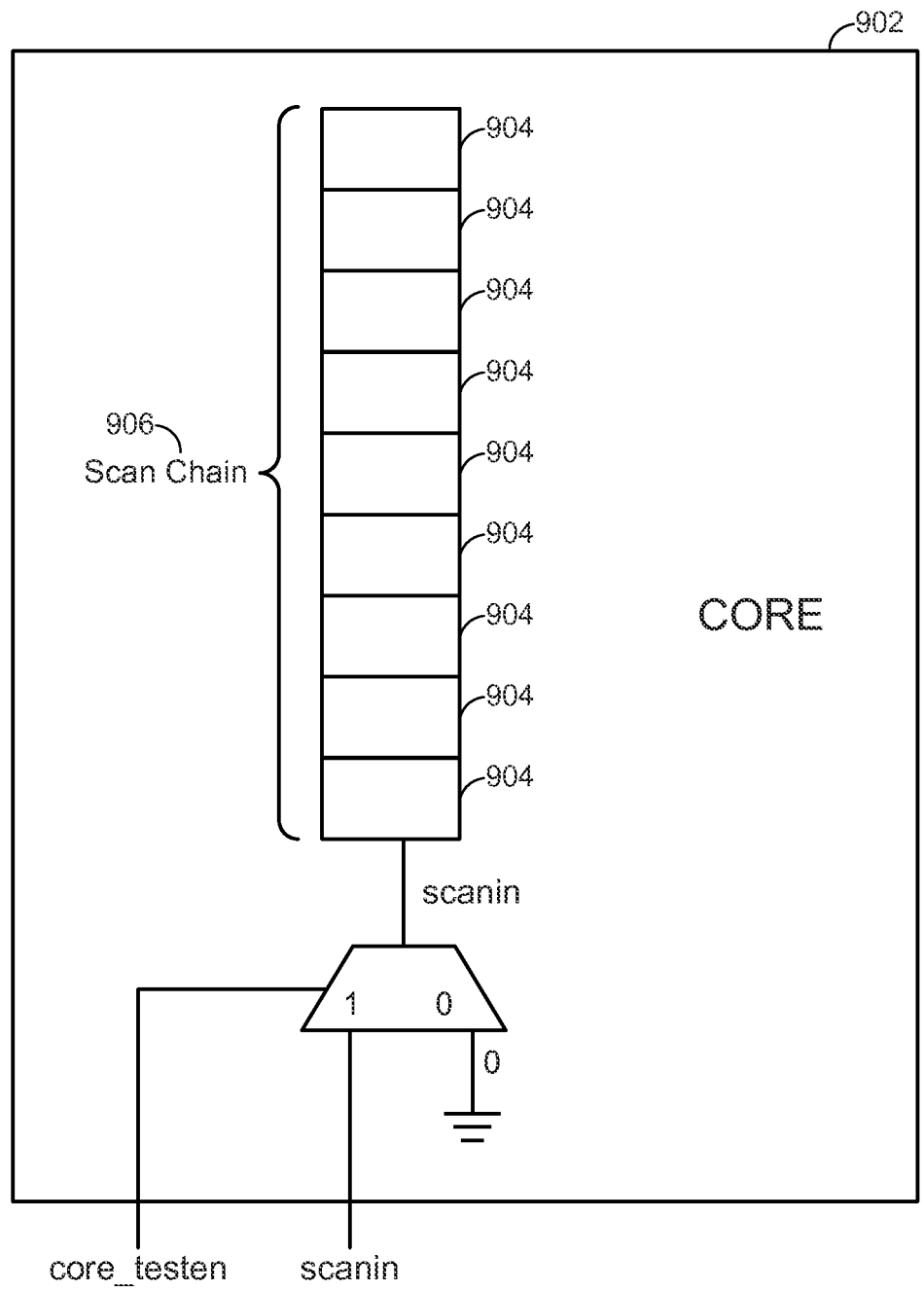
FIG. 9 is a schematic diagram of circuitry for implementing a minimum leakage state in a scan path according to an illustrative embodiment of the present disclosure.

Another aspect of the present disclosure reduces leakage at a scan path. Core based design for test (CBDFT) examples are described with reference to FIG. 9 to illustrate how leakage associated with a scan path is reduced. A CBDFT design may be partitioned into several cores 902 (only one of which is shown). In a core test mode, testing may be performed on one core 902 at a time.

The leakage power for individual scan flip flops 904 has been observed to be much lower in the SIN=0 state than in the SIN=1 state. The pin labeled "core_testen" represents the control signal that indicates if that particular core 902 is currently under test. According to this aspect of the disclosure, the scan path 906 of CBDFT cores in core test mode is multiplexed with a logical '0' such that whenever a particular CORE 902 is not being tested, core_testen signal is asserted and a logical 0 is shifted into the scan path. This initializes the scan path to logical '0s' in a particular core 902 whenever the particular core 902 is not being tested and puts the cores that are not being tested into their minimum leakage state. Only a small amount of additional logic hardware is added to implement the multiplexing described above in order to reduce leakage in scan path for cores not under test. In certain embodiments in which a core may include decompressor circuitry, the additional logic hardware is added at the output of the decompressor circuitry.

In another CBDFT example, the scan path may be initialized to 0s during a "top test" mode. During the top test mode, internal scan chains in a core do not perform launch or capture operations and therefore may be put into their minimum leakage state during the test. The hardware overhead for this technique is negligible and includes one multiplexor, which could be implemented as a single AND gate for each stump in the design, for example.

The core test mode example and the top test mode example described above are particular aspects of the present disclosure in which leakage power consumed by scan chains are reduced for designs with CBDFT methodology. Although aspects have been described for reducing leakage at a scan path in CBDFT examples, it should be understood that these aspects can also be applied for non-CBDFT based designs where one or more scan paths are inactive during test mode.

Aspects of the present disclosure also include a method of determining a minimum leakage state of an IC design using existing tools. In an illustrative embodiment, the problem of generating a minimum leakage state of combinational logic in an IC design is modeled as an automatic test pattern generator (ATPG) problem so that existing ATPG tools can be used to generate the minimum logic state. An example of a common ATPG tool that can be used for minimum leakage state generation according to illustrative embodiments of the present disclosure is "Encounter Test" by Cadence Design Systems of San Jose, Calif.

Figure 10:
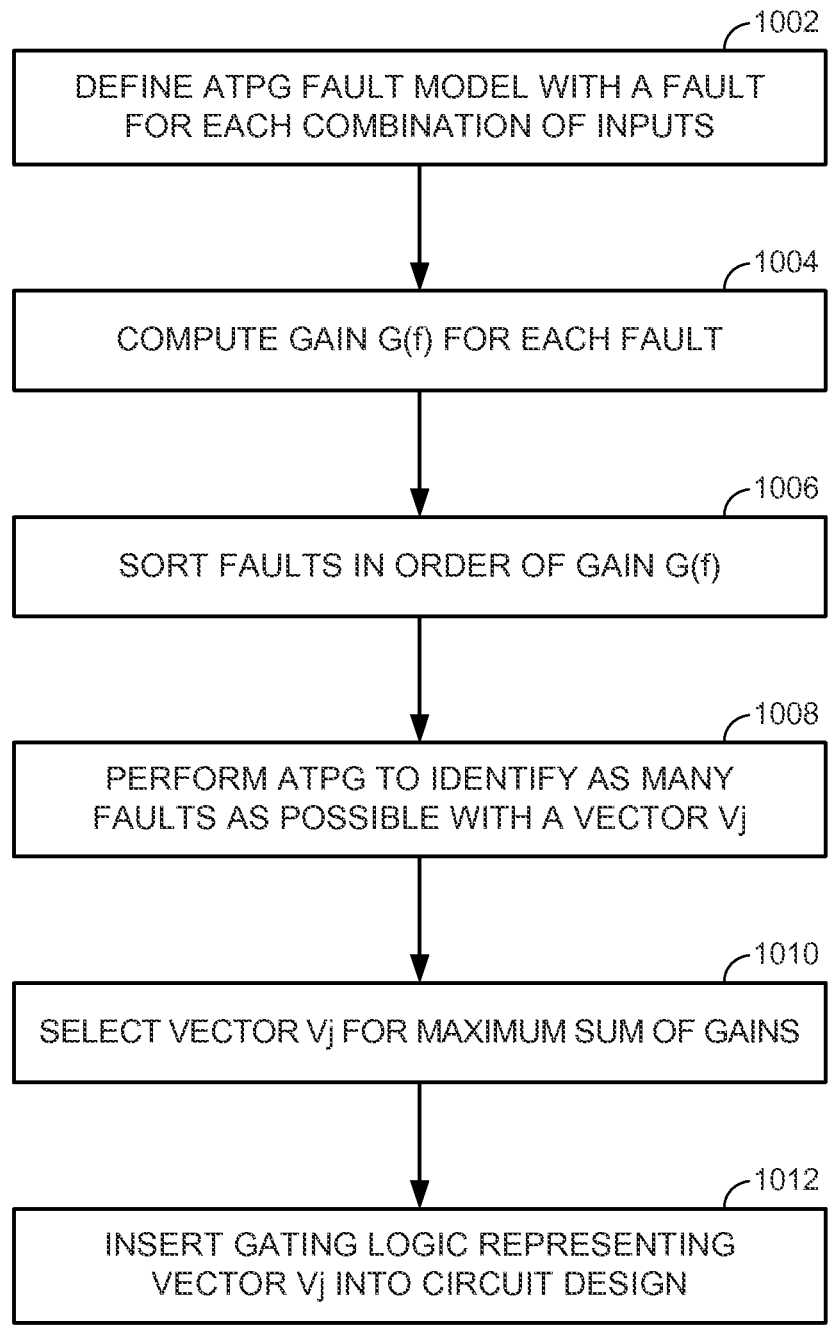
FIG. 10 is a process flow diagram showing a method of generating a minimum leakage state according to an illustrative embodiment of the present disclosure.

A method for determining a minimum leakage state using ATPG tools according to aspects of the present disclosure is described with reference to FIG. 10. In block 1002, a new fault model is defined for the ATPG tool. The new fault model represents a unique Boolean combination at the inputs of a standard cell in the design. In this fault model internal node are not observed. For example, for a 2-input AND gate, four faults F1, F2, F3, and F4 are generated. Fault F1 requires a "00" input for detection, fault F2 requires a "01" input for detection, fault F3 requires a "10" input for detection and F4 requires a "11" input for its detection. This fault model is used as a mechanism to translate the MLS generation problem into ATPG problem. It does not correlate with any physical defect.

In block 1004, a gain value is computed for each fault. For each fault "f" which corresponds to a particular Boolean pattern "P" to be applied at the input, a gain function G(f) is computed. The gain function G(f) represents the average leakage power reduction by applying "P" at the inputs of the particular gate. This can be performed using a ".lib" file of a standard ATPG tools, for example.

In block 1006, the faults are sorted by gain G(f) in descending order. Then, in block 1008, an automatic test pattern generation (ATPG) process is performed for the faults with a very high compaction level to detect as many faults $f_i$ (i=1 ... k), as possible with a vector $V_j$.

In block 1010, a vector $V_j$ is selected from the ATPG vector set such that the summation of the gains $G(f_i)$ [i=1 ... k] is maximum. Here, $f_1$ is the set of faults detected by $V_j$ in block 1008.

In block 1012, the minimum leakage state logic is inserted into the IC circuit design. For each care-bit $S_k$ of scan cell "k", an OR gate is inserted in the circuit design at the output of scan cell k if $S_k$='1' and a NOR gate is inserted in the circuit design at the output of scan cell k if $S_k$='0'. This effectively hard-codes vector "$V_j$" in the circuit design.

According to aspects of the present disclosure, the ATPG tools can be used to avoid modifying any timing critical paths. All timing-critical flip flops can be modeled as X generators during the ATPG process. This prevents the ATPG tool from placing a care-bit in the timing-critical flip flops and prevents modification to the timing critical paths.

Aspects of the present disclosure can conform to a user-defined budget of gates while optimizing leakage reduction in an IC design for the budgeted number of gates. Because each care-bit in the vector "$V_j$" increases hardware overhead by adding a logic gate to the design, the vector may be selected having no more care-bits than a number of additional logic gates allowed by a predetermined hardware budget. A number of gates exceeding the budget may be dropped from the design. According to the present disclosure, the gates to be dropped can be selected by identifying the corresponding care-bits that facilitate detecting faults with the least gain values.

Figure 11:
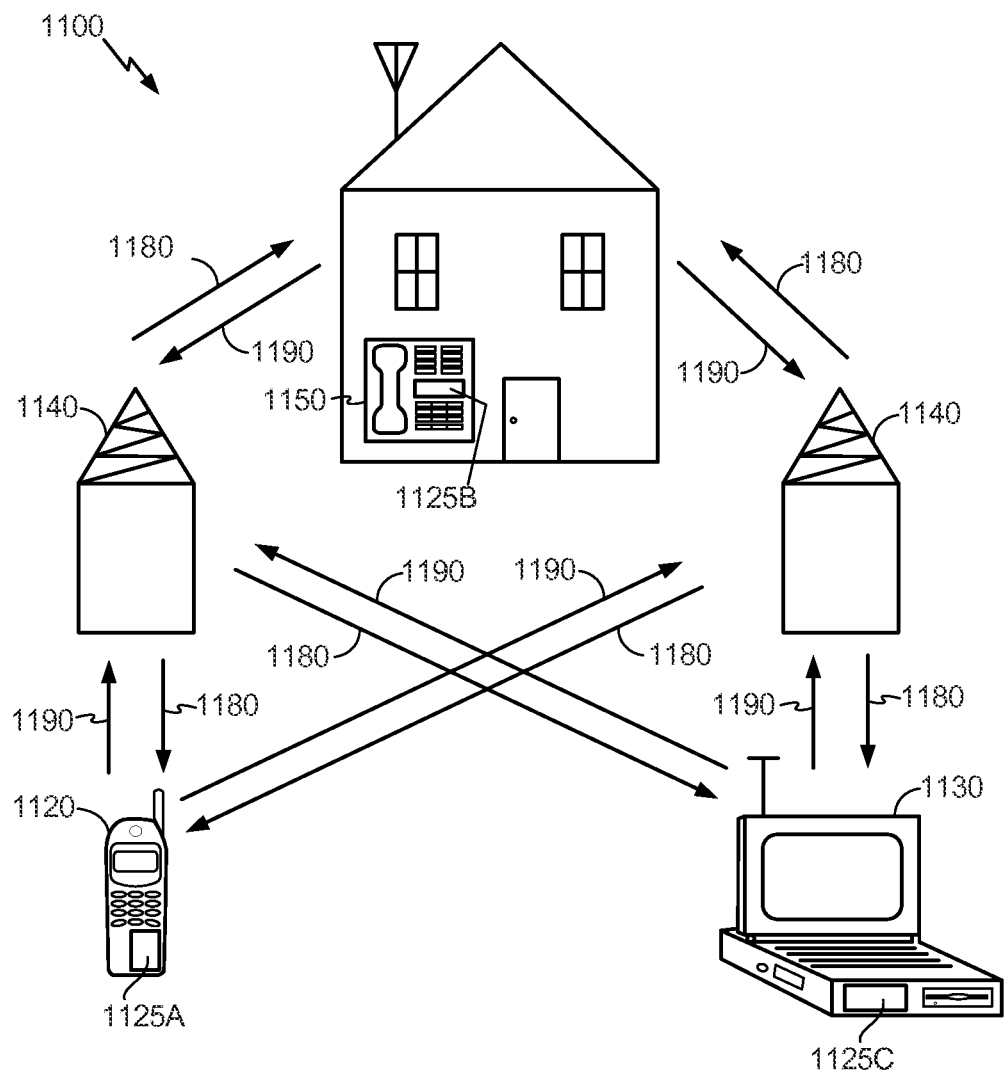
FIG. 11 is a block diagram showing an exemplary wireless communication system in which an embodiment of the disclosure may be advantageously employed.

FIG. 11 is a block diagram showing an exemplary wireless communication system 1100 in which an embodiment of the disclosure may be advantageously employed. For purposes of illustration, FIG. 11 shows three remote units 1120, 1130, and 1150 and two base stations 1140. It will be recognized that wireless communication systems may have many more remote units and base stations. Remote units 1120, 1130, and 1150 include IC devices 1125A, 1125C and 1125B, that include the disclosed circuitry. It will be recognized that any device containing an IC may also include the circuitry disclosed here, including the base stations, switching devices, and network equipment. FIG. 11 shows forward link signals 1180 from the base station 1140 to the remote units 1120, 1130, and 1150 and reverse link signals 1190 from the remote units 1120, 1130, and 1150 to base stations 1140.

In FIG. 11, remote unit 1120 is shown as a mobile telephone, remote unit 1130 is shown as a portable computer, and remote unit 1150 is shown as a fixed location remote unit in a wireless local loop system. For example, the remote units may be mobile phones, hand-held personal communication systems (PCS) units, portable data units such as personal data assistants, GPS enabled devices, navigation devices, set top boxes, music players, video players, entertainment units, fixed location data units such as meter reading equipment, or any other device that stores or retrieves data or computer instructions, or any combination thereof. Although FIG. 11 illustrates remote units according to the teachings of the disclosure, the disclosure is not limited to these exemplary illustrated units. Embodiments of the disclosure may be suitably employed in any device which includes integrated circuits (ICs).

Figure 12:
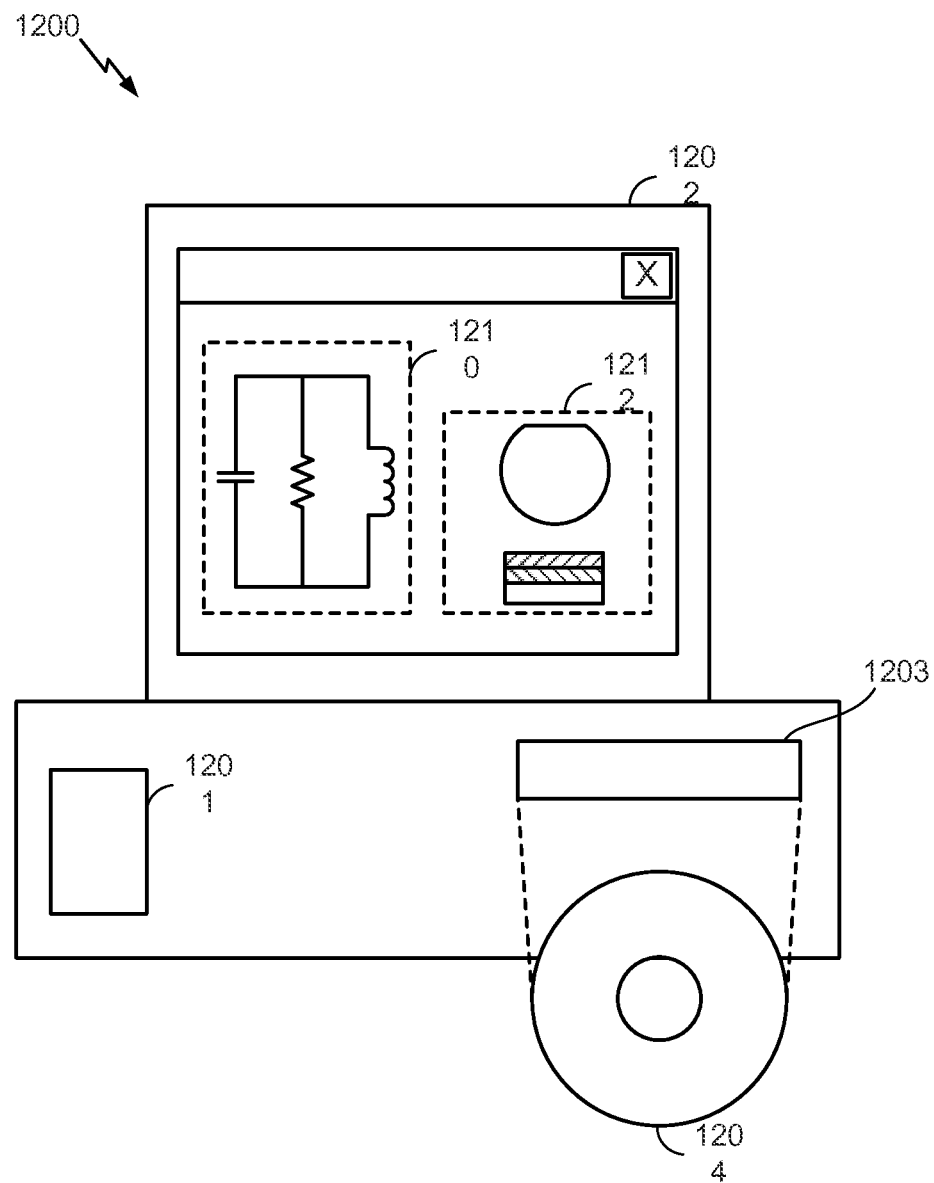
FIG. 12 is a block diagram illustrating a design workstation used for circuit, layout, and logic design of a semiconductor component according to an embodiment of the present disclosure.

FIG. 12 is a block diagram illustrating a design workstation used for circuit, layout, and logic design of a semiconductor component, such as a MLS generation circuitry as disclosed above. A design workstation 1200 includes a hard disk 1201 containing operating system software, support files, and design software such as Cadence or OrCAD. The design workstation 1200 also includes a display to facilitate design of a circuit 1210 or a semiconductor component 1212 such as a packaged integrated circuit having MLS generation circuitry. A storage medium 1204 is provided for tangibly storing the circuit design 1210 or the semiconductor component 1212. The circuit design 1210 or the semiconductor component 1212 may be stored on the storage medium 1204 in a file format such as GDSII or GERBER. The storage medium 1204 may be a CD-ROM, DVD, hard disk, flash memory, or other appropriate device. Further-more, the design workstation 1200 includes a drive apparatus 1203 for accepting input from or writing output to the storage medium 1204.

Data recorded on the storage medium 1204 may specify logic circuit configurations, pattern data for photolithography masks, or mask pattern data for serial write tools such as electron beam lithography. The data may further include logic verification data such as timing diagrams or net circuits associated with logic simulations. Providing data on the storage medium 1204 facilitates the design of the circuit design 1210 or the semiconductor component 1212 by decreasing the number of processes for designing semiconductor wafers.

For a firmware and/or software implementation, the methodologies may be implemented with modules (e.g., procedures, functions, and so on) that perform the functions described herein. Any machine-readable medium tangibly embodying instructions may be used in implementing the methodologies described herein. For example, software codes may be stored in a memory and executed by a processor unit. Memory may be implemented within the processor unit or external to the processor unit. As used herein the term "memory" refers to any type of long term, short term, volatile, nonvolatile, or other memory and is not to be limited to any particular type of memory or number of memories, or type of media upon which memory is stored.

If implemented in firmware and/or software, the functions may be stored as one or more instructions or code on a computer-readable medium. Examples include computer-readable media encoded with a data structure and computer-readable media encoded with a computer program. Computer-readable media includes physical computer storage media. A storage medium may be any available medium that can be accessed by a computer. By way of example, and not limitation, such computer-readable media can comprise RAM, ROM, EEPROM, CD-ROM or other optical disk storage, magnetic disk storage or other magnetic storage devices, or any other medium that can be used to store desired program code in the form of instructions or data structures and that can be accessed by a computer; disk and disc, as used herein, includes compact disc (CD), laser disc, optical disc, digital versatile disc (DVD), floppy disk and blu-ray disc where disks usually reproduce data magnetically, while discs reproduce data optically with lasers. Combinations of the above should also be included within the scope of computer-readable media.

In addition to storage on computer readable medium, instructions and/or data may be provided as signals on transmission media included in a communication apparatus. For example, a communication apparatus may include a transceiver having signals indicative of instructions and data. The instructions and data are configured to cause one or more processors to implement the functions outlined in the claims.

Although specific circuitry has been set forth, it will be appreciated by those skilled in the art that not all of the disclosed circuitry is required to practice the disclosure. Moreover, certain well known circuits have not been described, to maintain focus on the disclosure.

Although the present disclosure and its advantages have been described in detail, it should be understood that various changes, substitutions and alterations can be made herein without departing from the technology of the disclosure as defined by the appended claims. Moreover, the scope of the present application is not intended to be limited to the particular embodiments of the process, machine, manufacture, composition of matter, means, methods and steps described in the specification. As one of ordinary skill in the art will readily appreciate from the disclosure, processes, machines, manufacture, compositions of matter, means, methods, or steps, presently existing or later to be developed that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A circuit, comprising:
    a scan path comprising a chain of scan flip flops configured to shift a test vector to selected core circuitry under test from a plurality of core circuits, the test vector selected from a vector set, in which a summation of gains corresponding to faults detected by the vector is maximum;
    multiplexer circuitry of the selected core circuitry under test coupled to an input of the scan path, the multiplexer circuitry including an enable input and configured to output a logical '1' to a scan path input to shift the test vector to the selected core circuitry under test upon assertion of the enable input; and
    control circuitry coupled to the plurality of core circuits and configured to deassert an enable input to non-selected core circuits when testing the selected core circuitry under test to cause multiplexer circuitry of the non-selected core circuits to input a logical '0' to each of a chain of scan flip flops of the non-selected core circuits.

2. The circuit of claim 1,
    in which the control circuitry coupled to the multiplexer circuitry of the selected core circuitry under test is configured to assert the enable input when testing of the selected circuitry under test is inactive to cause the multiplexer circuitry to input a logical '0' to each of the scan flip flops.

3. The circuit of claim 1, integrated into at least one of a mobile phone, a set top box, a music player, a video player, an entertainment unit, a navigation device, a computer, a hand-held personal communication systems (PCS) unit, a portable data unit, and a fixed location data unit.

4. A method of generating a minimum leakage state in an integrated circuit design, comprising:
    defining a fault model in an automatic test pattern generator tool, in which each fault represents a unique Boolean combination at inputs of a standard cell in the integrated circuit design;
    computing a gain function for each of the faults, in which the gain function represents an average leakage power reduction for a corresponding fault;
    sorting the faults in order of the computed gain function for the faults;
    generating a vector set by performing an automatic test pattern generation to detect as many of the faults as possible with vectors of the set; and
    selecting a vector of the set in which a summation of gains corresponding to the faults detected by the vector is maximum.

5. The method of claim 4, further comprising:
    hard-coding care bits of the vector in the design.

6. The method of claim 4, further comprising:
    inserting an OR gate in the circuit design for each logical '1' care-bit of the vector; and inserting a NOR gate in the circuit design for each logical '0' care-bit of the vector.

7. The method of claim 6, further comprising:
inserting the OR gates and the NOR gates between scan flip flops of circuitry and a cone of logic of the circuitry.

8. The method of claim 6, further comprising:
modeling timing critical flip flops as X generators in the fault model to configure the automatic test pattern generator tool to place don't-care-bits in vector elements corresponding to the timing critical flip flops.

9. The method of claim 6, further comprising:
identifying care-bits of the vector that correspond to faults having least gain; and
disregarding a number of the identified care bits to maintain a number of the OR gates and the NOR gates within a predetermined budget.

10. The method of claim 4, further comprising integrating the circuit design into at least one of a mobile phone, a set top box, a music player, a video player, an entertainment unit, a navigation device, a computer, a hand-held personal communication systems (PCS) unit, a portable data unit, and a fixed location data unit.

11. An apparatus for generating a minimum leakage state in an integrated circuit design, comprising:
means for defining a fault model in an automatic test pattern generator tool in which each fault represents a unique Boolean combination at inputs of a standard cell in the integrated circuit design;
means for computing a gain function for each of the faults, in which the gain function represents an average leakage power reduction for a corresponding fault;
means for sorting the faults in order of the computed gain function for the faults;
means for generating a vector set by performing an automatic test pattern generation to detect as many of the faults as possible with vectors of the set; and
means for selecting a vector of the set in which a summation of gains corresponding to the faults detected by the vector is maximum.

12. The apparatus of claim 11, integrated into at least one of a mobile phone, a set top box, a music player, a video player, an entertainment unit, a navigation device, a computer, a hand-held personal communication systems (PCS) unit, a portable data unit, and a fixed location data unit.

13. A method of generating a minimum leakage state in an integrated circuit design, comprising the steps of:
defining a fault model in an automatic test pattern generator tool in which each fault represents a unique Boolean combination at inputs of a standard cell in the integrated circuit design;
computing a gain function for each of the faults, in which the gain function represents an average leakage power reduction for a corresponding fault;
sorting the faults in order of the computed gain function for the faults;
generating a vector set by performing an automatic test pattern generation to detect as many of the faults as possible with vectors of the set; and
selecting a vector of the set in which a summation of gains corresponding to the faults detected by the vector is maximum.

14. The method of claim 13, further comprising the step of integrating the circuit design into at least one of a mobile phone, a set top box, a music player, a video player, an entertainment unit, a navigation device, a computer, a hand-held personal communication systems (PCS) unit, a portable data unit, and a fixed location data unit.

15. A computer program product comprising:
a computer-readable medium having program code recorded thereon, the program code comprising:
program code to define a fault model in an automatic test pattern generator tool in which each fault represents a unique Boolean combination at inputs of a standard cell in an integrated circuit design;
program code to compute a gain function for each of the faults, in which the gain function represents an average leakage power reduction for a corresponding fault;
program code to sort the faults in order of the computed gain function for the faults;
program code to generate a vector set by performing an automatic test pattern generation to detect as many of the faults as possible with vectors of the set; and
program code to select a vector of the set in which a summation of gains corresponding to the faults detected by the vector is maximum.

16. The computer program product of claim 15, integrated into at least one of a mobile phone, a set top box, a music player, a video player, an entertainment unit, a navigation device, a computer, a hand-held personal communication systems (PCS) unit, a portable data unit, and a fixed location data unit.

17. A circuit, comprising:
means for shifting a test vector to selected core circuitry under test from a plurality of core circuits, the test vector selected from a vector set in which a summation of gains corresponding to faults detected by the vector is maximum;
multiplexer circuitry of the selected core circuitry coupled to an input of the shifting means, the multiplexer circuitry including an enable input and configured to output a logical '1' to the input of the shifting means upon assertion of the enable input to shift the test vector to the selected core circuitry under test; and
control circuitry coupled to the plurality of core circuits and configured to deassert an enable input to non-selected core circuits when testing the selected core circuitry under test to cause multiplexer circuitry of the non-selected core circuits to input a logical '0' to shifting means of the non-selected core circuits.

18. The circuit of claim 17, integrated into at least one of a mobile phone, a set top box, a music player, a video player, an entertainment unit, a navigation device, a computer, a hand-held personal communication systems (PCS) unit, a portable data unit, and a fixed location data unit.

* * * * *